United States Patent [19]

Neuendorff

[11] 4,179,643
[45] Dec. 18, 1979

[54] CIRCUIT FOR VARYING AN OPERATING VOLTAGE OF A DEFLECTION AMPLIFIER OF A MAGNETODYNAMIC DEFLECTION SYSTEM

[75] Inventor: Hans Neuendorff, Berlin, Fed. Rep. of Germany

[73] Assignee: Siemens Aktiengesellschaft, Munich, Fed. Rep. of Germany

[21] Appl. No.: 879,587

[22] Filed: Feb. 21, 1978

[30] Foreign Application Priority Data

Mar. 14, 1977 [DE] Fed. Rep. of Germany ....... 2711535

[51] Int. Cl.² .............................................. H01J 29/70
[52] U.S. Cl. ...................................... 315/411; 358/190
[58] Field of Search ............... 315/399, 408, 410, 403, 315/411; 358/190

[56] References Cited

U.S. PATENT DOCUMENTS

| 3,341,716 | 9/1967 | Chilton ............................ 315/410 X |
| 3,659,115 | 4/1972 | Montgomery .................. 315/410 X |

Primary Examiner—Theodore M. Blum
Attorney, Agent, or Firm—Kenyon & Kenyon

[57] ABSTRACT

An improved circuit for the stepwise variation of an operating voltage of a deflection amplifier of a magnetodynamic deflection system for a charged-particle beam in dependence upon a required deflection speed. At least one diode is coupled to a voltage supply source and is poled in its forward conduction direction to an operating voltage terminal of the deflection amplifier. At least one capacitor is coupled by a terminal thereof to the cathode of the diode, and a switch driven by a control device is coupled to the other terminal of the capacitor for connecting the capacitor either to ground through a resistor or to the anode of the diode.

4 Claims, 4 Drawing Figures

CIRCUIT FOR VARYING AN OPERATING VOLTAGE OF A DEFLECTION AMPLIFIER OF A MAGNETODYNAMIC DEFLECTION SYSTEM

BACKGROUND OF THE INVENTION

1. Field of the Invention

The present invention relates to a circuit for the stepwise variation of an operating voltage of a deflection amplifier of a magnetodynamic deflection system for a charged-particle beam in dependence upon a required deflection speed which is particularly useful in a television monitor which serves as the display equipment of a charged-particle beam apparatus.

2. Description of the Prior Art

In magnetodynamic deflection systems, a charged-particle beam is deflected by the magnetic field of a coil. The magnitude of this deflection is proportional to the current which flows through the coil; the deflection velocity, therefore, depends upon the rate of change of the current flow. At velocities at which the inductive reactance of the coil predominates, the rate of change of the current flow is proportional, in the current range utilized, to the voltage applied to the deflection coil. The faster the beam is to be deflected, the higher the voltage must be at the deflection coil. This also requires a high supply voltage at the deflection amplifier. The higher this supply voltage, however, the higher the power dissipation, for example, in the collector resistors of the deflection amplifier. If the deflection amplifier were to be continuously operated at the highest supply voltage required for maximum deflection velocity, a power dissipation loss would result which would be intolerably high for the application.

In television receivers, for example, in which there are only two different deflection velocities, namely, that for the forward sweep and that for the substantially faster flyback, power loss is reduced through the use of a power-reducing resonance system which is tuned to the operating frequency of the flyback. In television monitors used as display devices in scanning charged-particle beam microscopes, however, another operating range with frame times between 20 ms and hundreds or thousands of seconds must be covered and it should be possible to operate in modes such as raster scan and random positioning (vector writing). For such a broad frequency spectrum of deflection velocities, a resonant system is not usable for power reduction.

In a magnetodynamic deflection system presently known in the art, the high operating voltage required for rapid deflection is applied to the deflection amplifier only during brief, defined periods of time and otherwise remains at a lower, normal value. See U.S. Pat. No. 3,887,829. The power dissipation loss is, therefore, reduced to a small residual amount. The brief period during which the operating voltage is high is, therefore, limited for raster scan to the line flyback, and in the case of random positioning, to writing particularly rapid (long) vectors. In the magnetodynamic deflection system described in the foregoing patent, two separate power supply sources are used, one of which furnishes a normal supply voltage for slow deflection and the other one of which furnishes a high supply voltage for rapid deflection.

SUMMARY OF THE INVENTION

It is therefore an object of the present invention to overcome the aforementioned disadvantages of heretofore known circuits and to provide an improved circuit for varying the operating voltage of a deflection amplifier of a magnetodynamic deflection system for a charged-particle beam in dependence upon a required deflection speed which is characterized by low power losses and which simultaneously enables the saving of hardware.

These and other objects of the invention are achieved in a circuit for the stepwise variation of an operation voltage of a deflection amplifier of a magnetodynamic deflection system for a charged-particle beam in dependence upon a required deflection speed. The improvement comprises a voltage supply source; at least one diode coupled to the voltage supply source and poled in its forward conduction direction to an operating voltage terminal of the deflection amplifier; at least one capacitor having one terminal thereof coupled to the cathode of the diode; and a switch coupled to the other terminal of the capacitor and driven by a control device for connecting the capacitor either to ground through a resistor or to the anode of the diode.

The circuit of the invention has the advantage that the normal voltage and the voltage used to raise the operating voltage to a higher value for rapid deflection are taken from the same power supply. This eliminates the need for a second supply voltage source.

Considering first the simplest embodiment of the invention, i.e., that in which only one diode and one capacitor are utilized, the operation of the circuit of the invention is as follows:

During slow deflection of the beam, for example, during the forward sweep of the writing beam of a cathode ray tube, the capacitor is connected by the switch to a resistor coupled in parallel relationship to the supply voltage source and is charged. For rapid deflection, for example, for the return sweep of the writing beam of the cathode ray tube, the switch position is changed so that the same terminal of the capacitor is connected to the anode of the diode. The operating voltage, as a result, rises to twice the value of the supply voltage. The capacitor must be designed so that its charge is sufficient for the time period of rapid deflection. If doubling the supply voltage is not sufficient, the circuit must be repeated several times, i.e., several capacitors must be connected in parallel relationship to the supply voltage source which are charged during rapid deflection and are connected in parallel relationship to the respective diodes during rapid deflection for raising the operating voltage.

Up to certain frequencies, fast-acting relays can be used as switches. The circuit is preferably designed so that the switch or switches used are semiconductor switches. These semiconductor switches can be driven, for example, by pulses. The advantages that can be obtained with the invention are particularly significant, however, if a differentiating device is used as a control device, the input terminal of which is connected to the input terminal of the deflection amplifier. In this manner, the differentiating device assures that the operating voltage is raised if and only if it is necessary. This applies for any waveshape of the deflection current. A symmetrical arrangement with two circuits designed according to the invention for increasing the operating voltage and two differentiating devices for positive and negative operating voltages is particularly useful for an x-y display or scanning corpuscular-beam microscope or an x-y recorder with random positioning. This leads to a vector method having reduced power dissipation loss. The circuit is particularly well suited for this application, since the capacitor can always be designed so that it is sufficient for all conceivable operational conditions and the circuit, therefore, does not present a limitation for writing the desired vectors.

These and other novel features and advantages of the invention will be described in greater detail in the following detailed description.

BRIEF DESCRIPTION OF THE DRAWINGS

In the drawings, wherein similar reference numerals denote similar elements throughout the several views thereof.

DETAILED DESCRIPTION

Figure 1:
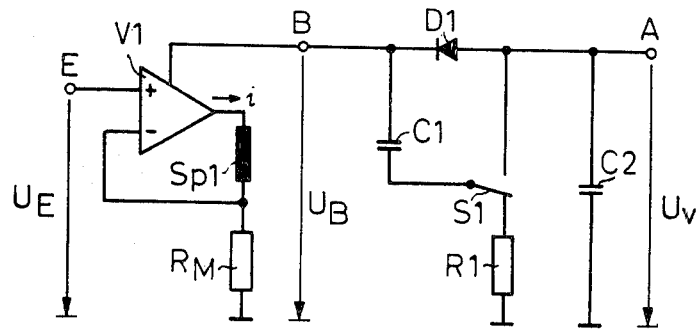
FIG. 1 is a schematic diagram of one embodiment of an improved circuit for the stepwise variation of an operating voltage of a deflection amplifier of a magnetodynamic deflection system constructed according to the present invention, showing the deflection coil and deflection amplifier of the deflection system and the elements of the circuit for raising the supply voltage of the deflection amplifier.

Referring now to the drawings, and in particular to FIG. 1, there is shown a deflection amplifier V1, which drives, for example, a sawtooth current i through a deflection coil Sp1 and a measuring resistor $R_M$. Amplifier V1 is driven at an input terminal E by the voltage $U_E$. In a television monitor for a scanning charged-particle beam microscope, the sawtooth waveform of the current may have a period between 60 $\mu s$ and several seconds. The minimum flyback time is 10 $\mu s$. In order to drive the required current i through the deflection coil Sp1 with the inductivity L during such a short flyback time, a higher voltage must be generated during the flyback time by the deflection amplifier V1 than during the forward sweep. And to enable the deflection amplifier V1 to supply such a high voltage, its supply voltage $U_B$ must also be high during this time. If the supply voltage were maintained at a constant level for such an application at a voltage sufficient to drive the current i through the deflection coil during the flyback time, power losses of several hundred watts would occur with the customary deflection currents of 8 $A_{p-p}$ (peak-to-peak). The circuit of the invention enables the doubling of the supply voltage at a high value for the brief duration of the flyback, but at half the value during the substantially longer time of the forward sweep. Power loss is accordingly almost halved.

Circuit point A is connected to the positive terminal of a supply voltage source (not shown), the negative terminal of which is connected to ground. The supply voltage $U_V$ is, therefore, present at the point A. During the forward sweep, the switch S1 is set in a position so that it connects the capacitor C1 to the resistor R1, as illustrated in FIG. 1. During this time, the capacitor C1 is charged and the voltage $U_B$, which is present at the circuit point B and represents the operating voltage, corresponds approximately to the supply voltage $U_V$. During the flyback, the switch S1 is switched and the operating voltage $U_B$ rises to twice the value of the supply voltage $U_V$. The capacitor C1 must be designed so that its charge is sufficient for the flyback time. The capacitor C2 connected in shunt to the supply voltage source serves to smooth the voltage and in particular to suppress the voltage spikes caused by the switching.

Figures 2, 3:
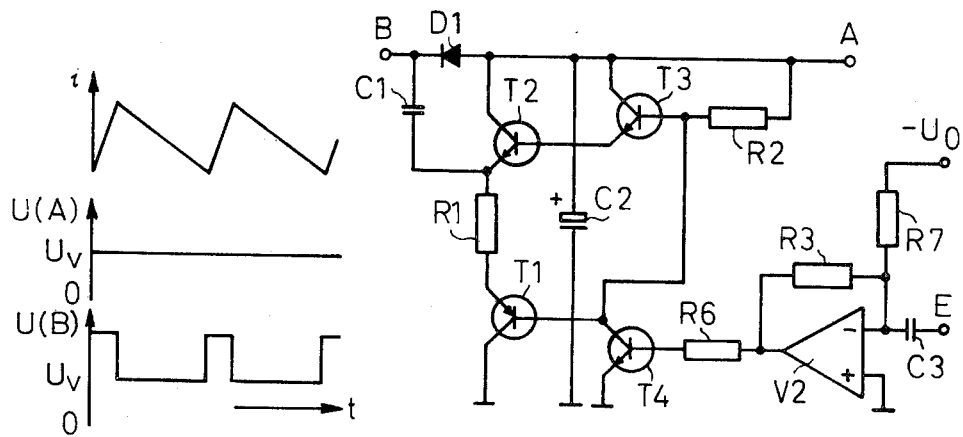
FIG. 2 is a graphical diagram illustrating the waveform of the current flowing through the deflection coil, the supply voltage applied to the circuit of the invention, and the operating voltage of the deflection amplifier.
FIG. 3 is another embodiment of an improved circuit for the stepwise variation of an operating voltage of a deflection amplifier of a magnetodynamic deflection system constructed according to the present invention in which transistors are utilized as switches and are controlled by a differentiating device.

In the upper portion in FIG. 2, the sawtooth waveform of the current i which flows through the deflection coil Sp1 is shown. As can be seen from this waveshape, the flyback time is substantially shorter than the forward sweep. In the middle portion of the FIG., the voltage at the circuit point A is plotted. This voltage corresponds to the supply voltage $U_V$ and is constant in time. In the lower portion of the Figure, the voltage at the circuit point B is plotted. This is the operating voltage of deflection amplifier V1 and its waveform is as follows: During the forward sweep, this voltage is approximately equal to the supply voltage $U_V$ and during the briefer flyback time it rises to twice the value.

FIG. 3 illustrates another embodiment of the circuit of the invention. As in the embodiment of FIG. 1, the supply voltage is applied to circuit point A and the operating voltage is generated at circuit point B. The charging capacitor C1 and the resistor R1 are the same; an electrolytic capacitor is used, however, as the smoothing capacitor C2. The switch S1 of the circuit shown in FIG. 1 is realized in this embodiment by four transistors T1 to T4. This switch is driven by the base of the transistor T4, which is connected to the output terminal of a differential amplifier V2. Through the capacitor C3, the same input voltage $U_E$ is transmitted to the inverting input terminal of differential amplifier V2 as is supplied to the non-inverting input terminal of deflection amplifier V1. R3 comprises a feedback resistor.

The circuit is designed so that during the slow forward sweep, transistor T4 conducts. This is achieved by the negative d-c voltage $-U_o$, for example, the negative supply voltage, which is supplied through the resistor R7 to the inverting input terminal of differential amplifier V2. This voltage is generated at the output terminal of amplifier V2 and is positive, decreased by the voltage drop at the resistor R6, at the base of transistor T4, whereby the latter becomes definitely conducting. The base of the transistor T1 is thereby almost at ground potential so that this transistor conducts and capacitor C1 charges through the resistor R1. During the rapid flyback (a positive voltage rise of $U_e$), a considerably more negative voltage is present at the output terminal of differential amplifier V2 so that transistor T4 is cut off. Since no current then flows through the collector resistor R2 of this transistor, the base of transistor T1 is practically at the same positive potential as the circuit point A. Transistor T1 is thereby also cut off. With this voltage situation, transistor T3 and T2 on the other side, which are cascaded in a quasi-Darlington circuit in order to ensure fast and reliable switching of the capacitor C1, conduct.

Figure 4:
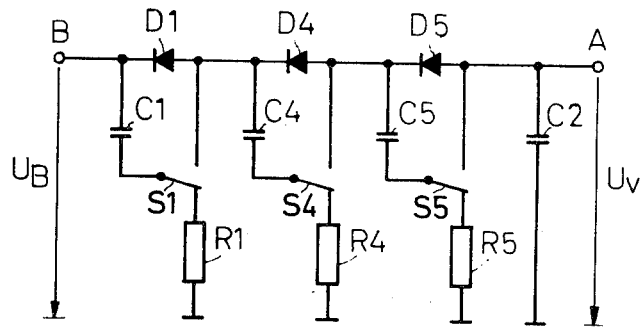
FIG. 4 is still another embodiment of an improved circuit for the stepwise variation of an operating voltage of a deflection amplifier of a magnetodynamic deflection system constructed according to the present invention which multiplies the supply voltage to the deflection amplifier.

FIG. 4 illustrates a circuit constructed according to the invention for raising the operating voltage to four-times the value of the supply voltage $U_V$. In principle, this is the circuit illustrated in FIG. 1 but repeated several times between the circuit points A and B. During the forward sweep, capacitors C1, C4 and C5 are charged through the switches S1, S4 and S5. By switching all the switches simultaneously, the capacitors are connected in parallel relationship to corresponding diodes D1, D4 and D5. Series-connected stacked voltages are thereby obtained each time increased by the supply voltage $U_V$.

In the foregoing specification, the invention has been described with reference to specific exemplary embodiments thereof. It will, however, be evident that various modifications and changes may be made thereunto without departing from the broader spirit and scope of the invention as set forth in the appended claims. The specification and drawings are, accordingly, to be regarded in an illustrative rather than in a restrictive sense.

What is claimed is:

1. In a circuit for the stepwise variation of an operating voltage of a deflection amplifier of a magnetodynamic deflection system for a charged-particle beam in dependence upon a required deflection speed, the improvement comprising a single voltage supply source for generating a supply voltage, at least one diode coupled to said voltage supply source and poled in its forward conduction direction to an operating voltage terminal of said deflection amplifier, at least one capacitor having one terminal thereof coupled to the cathode of said diode, and a switch coupled to the other terminal of said capacitor and driven by a control device for connecting said capacitor either to ground through a resistor or to the anode of said diode, said circuit generating a first operating voltage at said operating voltage terminal of said deflection amplifier which is approximately equal to said supply voltage and is coupled to said operating voltage terminal of said deflection amplifier when said capacitor is connected by said switch to ground through said resistor, and a second operating voltage which is greater than said first operating voltage and is coupled to said operating voltage terminal of said deflection amplifier when said capacitor is connected by said switch to said anode of said diode.

2. The circuit recited in claim 1, wherein said switch comprises a semiconductor switch.

3. the circuit recited in claim 1, wherein said control device comprises a differentiating device, one input terminal of which is coupled to an input terminal of said deflection amplifier.

4. The circuit recited in claim 1, wherein a plurality of diodes are coupled to said voltage supply source and are poled in the forward conduction direction to said operating voltage terminal of said deflection amplifier; wherein a plurality of capacitors corresponding in number to the number of said diodes are each coupled by one terminal thereof to the cathode of a respective one of said diodes; and wherein a plurality of switches driven in common by said control device are each coupled to one of the other terminals of said capacitors for connecting said capacitors either to ground through a resistor or to the anode of a respective one of said diodes.

* * * * *